United States Patent
Odani

(10) Patent No.: US 6,266,276 B1
(45) Date of Patent: Jul. 24, 2001

(54) NON-VOLATILE SEMICONDUCTOR MEMORY DEVICE AND INTERNAL OPERATION METHOD FOR SAID NON-VOLATILE SEMICONDUCTOR MEMORY DEVICE

(75) Inventor: Nobutsugu Odani, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/464,393

(22) Filed: Dec. 16, 1999

(30) Foreign Application Priority Data

Dec. 17, 1998 (JP) ................................... 10-358307

(51) Int. Cl.$^7$ ................................... G11C 16/04
(52) U.S. Cl. ................................ 365/185.18; 365/185.19; 365/185.29
(58) Field of Search .................... 365/185.18, 185.19, 365/185.2, 185.22, 185.29

(56) References Cited

U.S. PATENT DOCUMENTS

| | | | | |
|---|---|---|---|---|
| 5,200,920 | * | 4/1993 | Norman | 365/201 |
| 5,914,896 | * | 6/1999 | Lee | 365/185.19 |
| 5,920,508 | * | 7/1999 | Miyakawa | 365/189.29 |

FOREIGN PATENT DOCUMENTS 7-334993   12/1995   (JP).

* cited by examiner

Primary Examiner—A. Zarabian
(74) Attorney, Agent, or Firm—Arent Fox Kintner Plotkin & Kahn, PLLC

(57) ABSTRACT

A non-volatile semiconductor memory device which is electrically writable and erasable is provided. The number of program/erase cycles in the non-volatile memory cells exceeds a predetermined value, a program high voltage and an erase high voltage are made higher, so that the erasing time can be shortened to achieve high-speed performance. More specifically, such a non-volatile semiconductor memory device is provided with a high-voltage generation circuit which selectively outputs a program high voltage of ±9.75 V or ±10.5 V. The high-voltage generation circuit outputs the program high voltage of ±9.75 V until the number of program/erase cycles in the non-volatile memory cells in the memory cell array exceeds a predetermined value. When the number of program/erase cycles exceeds the predetermined value, the high-voltage generation circuit outputs the program high voltage of ±10.5 V. The number of program/erase cycles is counted by a stacked-gate-type MOS transistor.

18 Claims, 15 Drawing Sheets

|  | CONTROL GATE VOLTAGE | SOURCE VOLTAGE | DRAIN VOLTAGE |
|---|---|---|---|
| PROGRAM | VPP(10V) | VSS(0V) | VCC(5V) |
| ERASE | −VPP(−10V) | VCC(5V) | OPEN |
| READ | VCC(5V) | VSS(0V) | +2V |

FIG.4A PRIOR ART
BEFORE ERASE
| 1 | 0 | 1 |
|---|---|---|
| 0 | 1 | 1 |
| 0 | 1 | 1 |
FIG.4B PRIOR ART
AFTER PRE-PROGRAM
| 0 | 0 | 0 |
|---|---|---|
| 0 | 0 | 0 |
| 0 | 0 | 0 |
FIG.4C PRIOR ART
AFTER ERASE
| 1 | 1 | 1 |
|---|---|---|
| 1 | 1 | 1 |
| 1 | 1 | 1 |
FIG.5 PRIOR ART
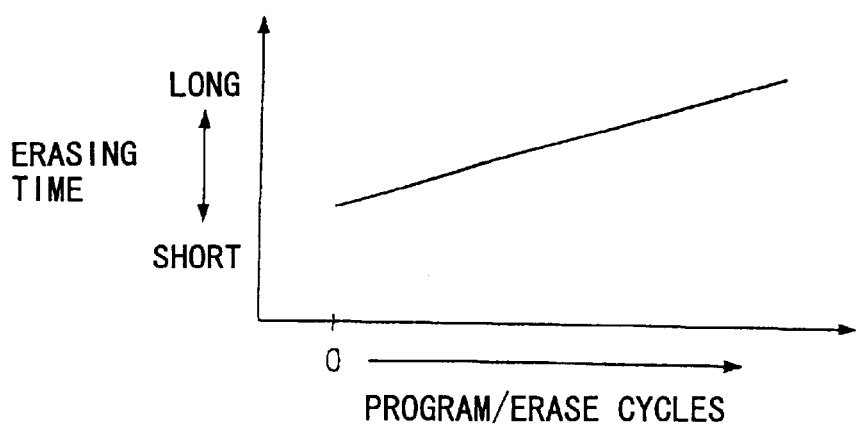

NON-VOLATILE SEMICONDUCTOR MEMORY DEVICE AND INTERNAL OPERATION METHOD FOR SAID NON-VOLATILE SEMICONDUCTOR MEMORY DEVICE

BACKGROUND OF THE INVENTION

1. Field of the Invention

The present invention generally relates to non-volatile semiconductor memory devices and internal operation methods for the same. More particularly, the present invention relates to a non-volatile semiconductor memory device which is electrically erasable and writable, such as a flash memory, and also to an internal operation method for such a non-volatile semiconductor memory device.

2. Description of the Related Art

FIG. 1 is a circuit diagram showing an example of a conventional non-volatile semiconductor memory device which is electrically erasable and programmable. In this figure, reference numeral 1 indicates a memory cell array in which non-volatile memory cells consisting of electrically erasable and programmable stacked-gate-type n-channel MOS transistors are arranged. Reference numeral 2 indicates a command register circuit which receives commands from outside, and reference numeral 3 indicates a pre-program/erase control circuit which controls pre-program/erase in the memory cell array 1 when the command register circuit 2 receives an erase command. Reference numeral 4 indicates a booster circuit which generates a boosted voltage, and reference numeral 5 indicates a voltage limiter circuit which limits the voltage value of the boosted voltage outputted from the booster circuit 4, and which steadily outputs high voltages VPP/–VPP necessary for performing program/erase in the non-volatile memory cells in the memory cell array 1.

FIG. 2 is a schematic sectional view of a non-volatile memory cell in the memory cell array 1. In this figure, reference numeral 7 indicates a P-type well, reference numeral 8 indicates a source that is an N-type diffused layer, reference numeral 9 indicates a drain that is also an N-type diffused layer, reference numeral 10 indicates a control gate, and reference numeral 11 indicates a floating gate.

FIG. 3 is a table showing the control gate voltage, source voltage, and drain voltage when program, erase, and read is performed in the non-volatile memory cells in the memory cell array 1.

At the time of program, the control gate voltage is equal to a program high voltage VPP (10 V, for instance), the source voltage is equal to a ground voltage (0 V), and the drain voltage is equal to a power source voltage VCC (5 V, for instance). Electrons are injected from the drain 9 into the floating gate 11, and "0" is stored.

At the time of erase, the control gate voltage is equal to an erase high voltage –VPP (–10 V, for instance), the source voltage is equal to the power source voltage VCC (5 V, for instance), and the drain voltage is in an open state. Here, electrons are withdrawn from the floating gate 11 toward the source 8, and "1" is stored.

At the time of read, the control gate voltage is equal to the power source voltage VCC (5 V, for instance), the source voltage is equal to the ground voltage VSS (0 V), and the drain voltage is +2 V. Here, the stored data is read out as the size of the drain current.

FIGS. 4A to 4C illustrates an erase operation in the non-volatile memory cells in the memory cell array 1. FIG. 4A shows the stored data in the non-volatile memory cells in the memory cell array 1 before erase, FIG. 4B shows the stored data after pre-program, FIG. 4C shows the stored data after erase.

Before erase is performed in the non-volatile memory cells in the memory cell array 1, "0" is written in all the non-volatile memory cells as the pre-program process. The erase is then performed in all the non-volatile memory cells, and "1" is inputted into all the non-volatile memory cells.

FIG. 5 shows the relationship between the number of program/erase cycles and the erasing time in the no-volatile memory cells in the memory cell array 1. As the number of program/erase cycles in the non-volatile memory cells increases, the erasing time becomes longer due to deterioration of the tunnel oxide film or an electron trap in the tunnel oxide film.

FIG. 6 shows the relationship among a program/erase high voltage ±VPP, the number of program/erase cycles in the non-volatile memory cells, the erasing time, and the lives of the non-volatile memory cells. In this figure, a line 13 indicates a case where the program/erase high voltage ±VPP is normal, a line 14 indicates a case where the program/erase high voltage ±VPP is higher than the normal program/erase high voltage ±VPP, and a line 15 indicates a case where the program/erase high voltage ±VPP is lower than the normal program/erase high voltage ±VPP. Points "X" indicate when the non-volatile memory cells break down.

As can be seen from FIG. 6, in the case where the program/erase high voltage ±VPP is higher than the normal program/erase high voltage ±VPP, the erasing time can be shortened, thereby realizing high-speed erasing operation. However, there is a problem that the lives of the non-volatile memory cells become very short.

It should be understood here that, throughout the present specification, "increasing the erase high voltage –VPP" means increasing the absolute value of the erase high voltage –VPP, and "reducing the erase high voltage –VPP" means reducing the absolute value of the erase high voltage –VPP.

Meanwhile, as the number of program/erase cycles in the non-volatile memory cells, the reliability of the non-volatile memory cells deteriorates due to the deterioration of the tunnel oxide film or the electron trap in the tunnel oxide film. In view of this, in a case where the number of program/erase cycles in the non-volatile memory cells is larger than a predetermined value, the high voltage VPP is reduced, and the stress applied to the non-volatile memory cells is reduced to prevent a decrease in the reliability of the non-volatile memory cells. In such a case, however, it should be understood that the erasing time becomes longer.

SUMMARY OF THE INVENTION

A general object of the present invention is to provide non-volatile semiconductor memory devices in which the above disadvantages are eliminated.

A first specific object of the present invention is to provide a non-volatile semiconductor memory device which maintains high-speed performance by increasing the program voltage and the erase voltage so as to shorten the erasing time when the number of program/erase cycles in the non-volatile memory cells is larger than the predetermined value.

A second specific object of the present invention is to provide a non-volatile semiconductor memory device which can prevent a decrease in the reliability by reducing the program voltage and the erase voltage so as to reduce the stress applied to the non-volatile memory cells to prolong the lives of the non-volatile memory cells when the number of program/erase cycles in the non-volatile memory cells is larger than the predetermined value.

A third specific object of the present invention is to provide an internal operation method for a non-volatile semiconductor memory device, in which the erasing time can be shortened by increasing the program voltage and the erase voltage, and the lives of the non-volatile memory cells can be prevented from becoming too short, when the number of program/erase cycles in the non-volatile memory cells is larger than the predetermined value.

A fourth specific object of the present invention is to provide an internal operation method for a non-volatile semiconductor memory device, in which the stress applied to the non-volatile memory cells is reduced to prolong their lives by reducing the program voltage and the erase voltage, and a decrease in the reliability can be prevented, when the number of program/erase cycles in the non-volatile memory cells is larger than the predetermined value.

The above objects of the present invention are achieved by a non-volatile semiconductor memory device comprising: a memory cell array having arranged non-volatile memory cells which are electrically erasable and programmable; and a high-voltage supply circuit which supplies a first program voltage and a first erase voltage to the non-volatile memory cells in the memory cell array when the number of program/erase cycles in the non-volatile memory cells in the memory cell array is equal to or smaller than a predetermined value, and which supplies a second program voltage and a second erase voltage to the non-volatile memory cells in the memory cell array when the number of program/erase cycles in the non-volatile memory cells in the memory cell array is larger than the predetermined value. The second program and erase voltages are higher than the first program and erase voltages, respectively.

In this non-volatile semiconductor memory device, when the number of program/erase cycles in the non-volatile memory cells in the memory cell array is larger than the predetermined value, the program voltage and the erase voltage each having a higher voltage value can be supplied to the non-volatile memory cells. Accordingly, the prolonged erasing time can be shortened to speed up the erasing operation. Thus, high-speed performance can be maintained in the non-volatile semiconductor memory device.

The above objects of the present invention are also achieved by a non-volatile semiconductor memory device comprising: a memory cell array having arranged non-volatile memory cells which are electrically erasable and programmable; and a high-voltage supply circuit which supplies a first program voltage and a first erase voltage to the non-volatile memory cells in the memory cell array when the number of program/erase cycles in the non-volatile memory cells in the memory cell array is equal to or smaller than a predetermined value, and which supplies a third program voltage and a third erase voltage each having a lowered voltage value to the non-volatile memory cells in the memory cell array when the number of program/erase cycles in the non-volatile memory cells in the memory cell array is larger than the predetermined value. The second program and erase voltages are lower than the first program and erase voltages, respectively.

In this non-volatile semiconductor memory device, when the number of program/erase cycles in the non-volatile memory cells in the memory cell array, the program voltage and the erase voltage each having a lowered voltage value can be supplied to the non-volatile memory cells. Accordingly, the stress applied to the non-volatile memory cells can be reduced to prolong their lives, and a decrease in the reliability of the non-volatile semiconductor memory device can be prevented.

The above objects of the present invention are also achieved by an internal operation method for a non-volatile semiconductor memory device provided with a memory cell array having arranged non-volatile memory cells which are electrically erasable and programmable. This method comprises the steps of: supplying a first program voltage and a first erase voltage to the non-volatile memory cells in the memory cell array when the number of program/erase cycles in the non-volatile memory cells in the memory cell array is equal to or larger than a predetermined value; and supplying a second program voltage and a second erase voltage each having an increased voltage value to the non-volatile memory cells in the memory cell array when the number of program/erase cycles in the non-volatile memory cells in the memory cell array is larger the predetermined value.

According to this method, when the number of program/erase cycles in the non-volatile memory cells in the memory cell array is larger than the predetermined value, the program voltage and the erase voltage each having a higher voltage value can be supplied to the non-volatile memory cells. Accordingly, the prolonged erasing time can be shortened to speed up the erasing operation. Thus, high-speed performance can be maintained in the non-volatile semiconductor memory device.

The above objects of the present invention are also achieved by an internal operation method for a non-volatile semiconductor memory device provided with a memory cell array having arranged non-volatile memory cells which are electrically erasable and programmable. This method comprises the steps of: supplying a first program voltage and a first erase voltage to the non-volatile memory cells in the memory cell array when the number of program/erase cycles in the non-volatile memory cells in the memory cell array is equal to or larger than a predetermined value; and supplying a third program voltage and a third erase voltage each having a lowered voltage value to the non-volatile memory cells in the memory cell array when the number of program/erase cycles in the non-volatile memory cells in the memory cell array is larger than the predetermined value.

According to this method, when the number of program/erase cycles in the non-volatile memory cells in the memory cell array is larger than the predetermined value, the program voltage and the erase voltage each having a lowered voltage value can be supplied to the non-volatile memory cells. Accordingly, the stress applied to the non-volatile memory cells can be reduced to prolong their lives, and a decrease in the reliability of the non-volatile semiconductor memory device can be prevented.

The above and other objects and features of the present invention will become more apparent from the following description taken in conjunction with the accompanying drawings.

BRIEF DESCRIPTION OF THE DRAWINGS

FIGS. 4A to 4C illustrate an erasing operation in the non-volatile memory cells in the memory cell array of the non-volatile semiconductor memory device of FIG. 1;

FIG. 5 shows the relationship between the number of program/erase cycles and the erasing time in the non-volatile memory cells in the memory cell array of the non-volatile semiconductor memory device of FIG. 1;

DESCRIPTION OF THE PREFERRED EMBODIMENTS

Figure 1:
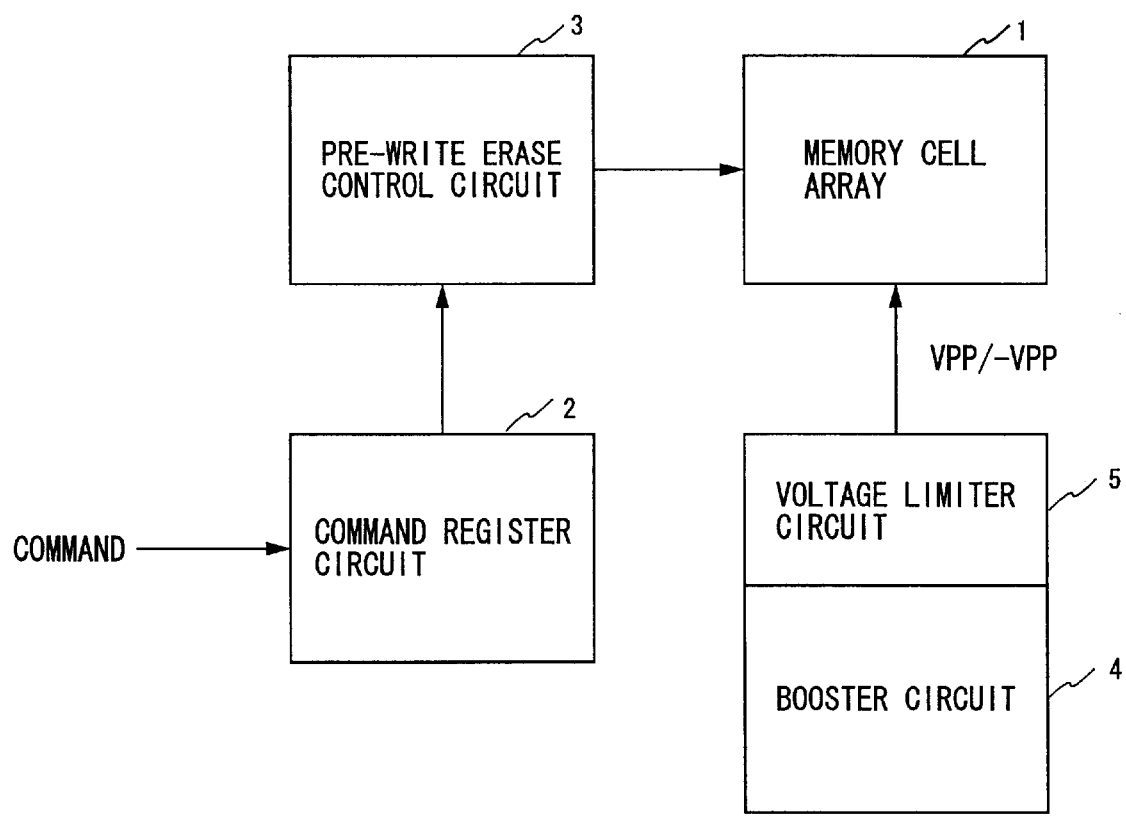
FIG. 1 is a circuit diagram showing the structure of an example of a non-volatile semiconductor memory device of the prior art.
Figures 2, 3:
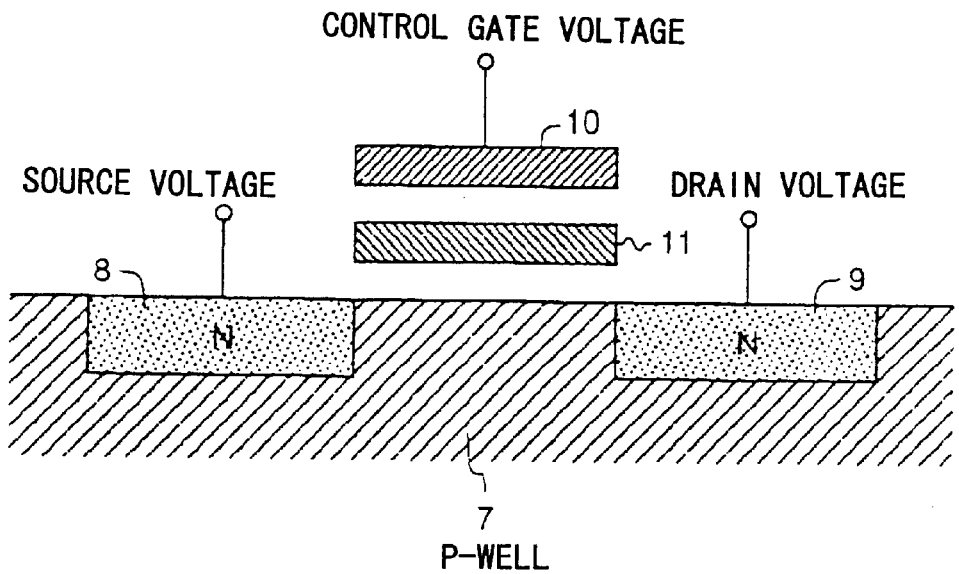
FIG. 2 is a schematic sectional view of a non-volatile memory cell in a memory cell array of the non-volatile semiconductor memory device of FIG. 1.
FIG. 3 is a table showing a control gate voltage, a source voltage, a drain voltage, when writing, erasing or reading in the non-volatile memory cells in the memory cell array of the non-volatile semiconductor memory device of FIG. 1.
Figure 6:
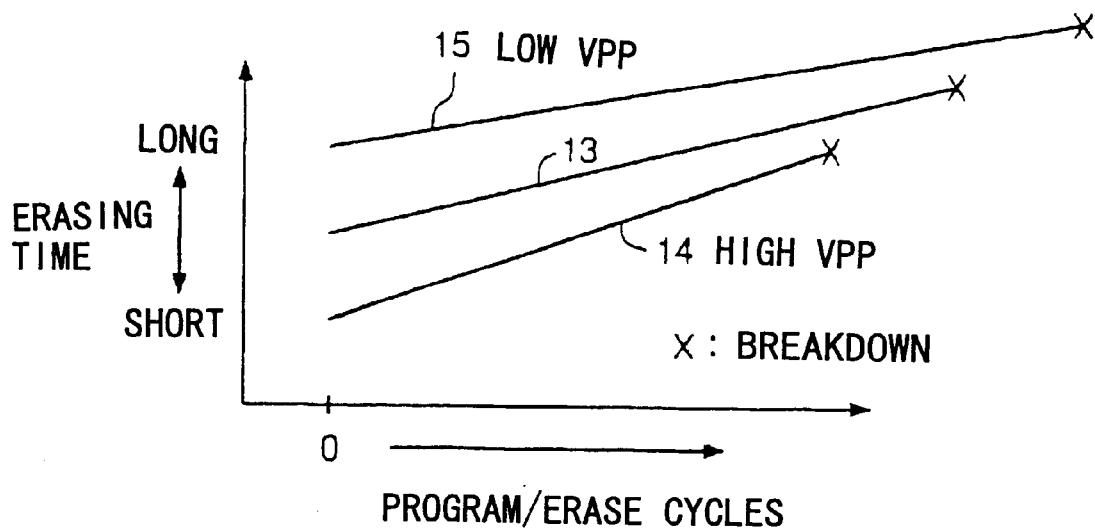
FIG. 6 shows the relationship among the size of the high voltage, the number of program/erase cycles, the erasing time, and the lives of the non-volatile memory cells.
Figure 7:
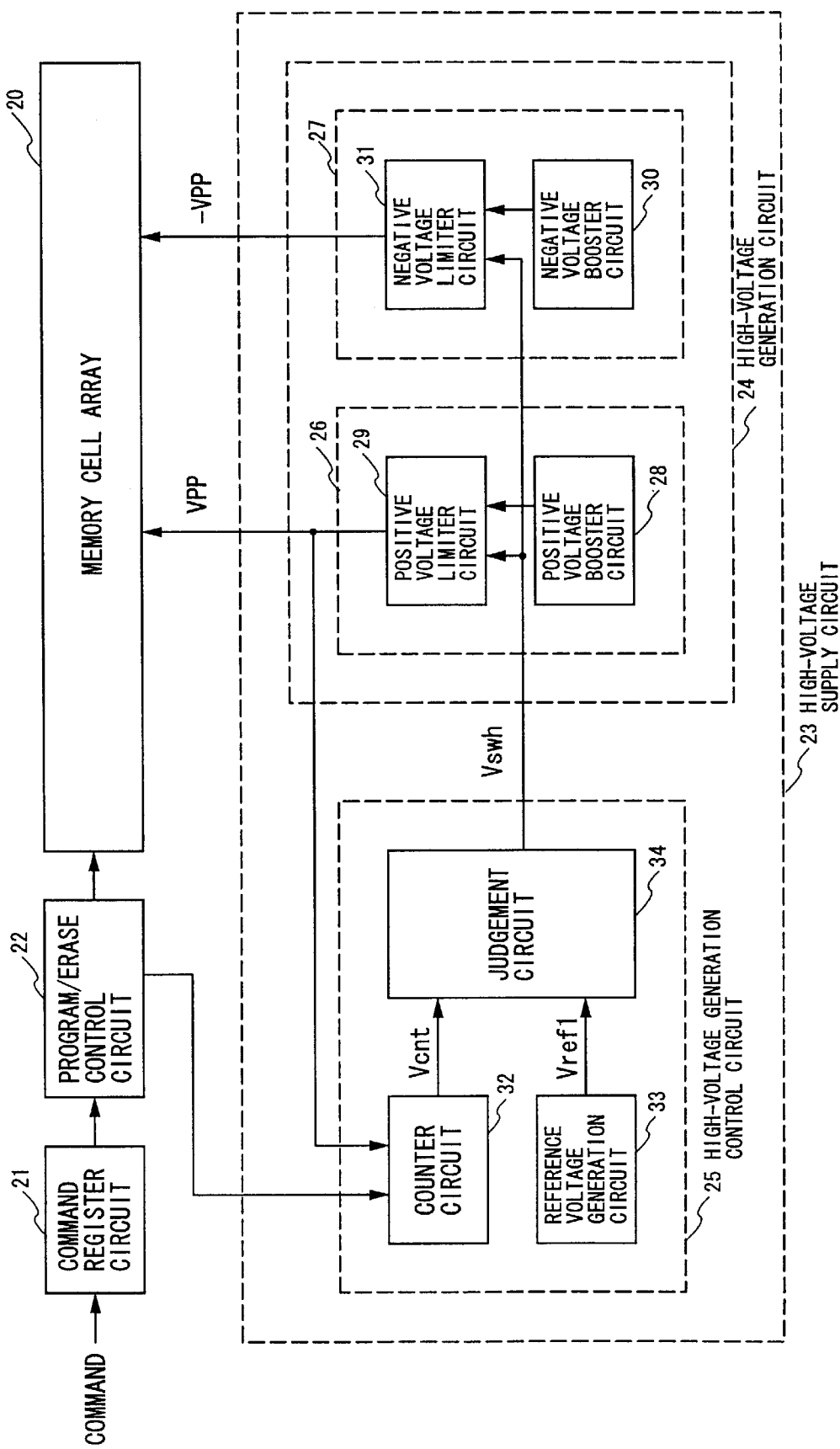
FIG. 7 is a circuit diagram showing a first embodiment of a non-volatile semiconductor memory device of the present invention.

The following is a description of embodiments of the present invention, with reference to the accompanying drawings. FIG. 7 is a circuit diagram showing a first embodiment of a non-volatile semiconductor memory device of the present invention. In FIG. 7, reference numeral 20 indicates a memory cell array in which non-volatile memory cells consisting of stacked-gate-type n-channel MOS transistors that are electrically writable and erasable, having the same structure as shown in FIG. 2. Reference numeral 21 indicates a command register circuit which receives commands from outside, and reference numeral 22 indicates a program/erase control circuit which controls pre-program and erase in the memory cell array 20, and program in a counter circuit described later, when the command register circuit 21 receives a clear command. Reference numeral 23 indicates a high-voltage supply circuit which supplies program high voltage VPP and erase high voltage −VPP to the non-volatile memory cells in the memory cell array 20. Reference numeral 24 indicates a high-voltage generating circuit which generates the program high voltage VPP and the erase high voltage −VPP. Reference numeral 25 indicates a high-voltage generation control circuit which controls each voltage value of the program high voltage VPP and the erase high voltage −VPP generated from the high-voltage generation circuit 24.

In the high-voltage generation circuit 24, reference numeral 26 indicates a program high-voltage generation circuit which generates the program high voltage VPP, and reference numeral 27 indicates a erase high-voltage generation circuit which generates the erase high voltage −VPP.

In the program high-voltage generation circuit 26, reference numeral 28 indicates a positive voltage booster circuit which generates positive boosted voltage by boosting power source voltage VCC, and reference numeral 29 indicates a positive voltage limiter circuit which steadily outputs the program voltage VPP by limiting the voltage value of the positive boosted voltage generated from the positive voltage booster circuit 28. The positive voltage limiter circuit 29 is controlled by the high-voltage generation control circuit 25 to selectively output a voltage of 9.75 V or 10.5 V as the program high voltage VPP.

In the erase high-voltage generation circuit 27, reference numeral 30 indicates a negative voltage booster circuit which generates negatively boosted voltage by boosting ground voltage VSS, and reference numeral 31 indicates a negative voltage limiter circuit which steadily outputs the erase voltage −VPP by limiting the voltage value of the negatively boosted voltage generated from the negative voltage booster circuit 30. The negative voltage limiter circuit 31 is controlled by the high-voltage generation control circuit 25 to selectively output a voltage of −9.75 V or −10.5 V as the erase high voltage −VPP.

In the high-voltage generation control circuit 25, reference numeral 32 indicates a counter circuit which counts the number of program times in the non-volatile memory cells in the memory cell array 20, and outputs the count value as a voltage $V_{cnt}$. Reference numeral 33 indicates a reference voltage generation circuit which generates a reference voltage $V_{ref1}$. Reference numeral 34 indicates a judgement circuit which compares the voltage $V_{cnt}$ outputted from the counter circuit 32 with the reference voltage $V_{ref1}$, and outputs a signal $V_{swh}$ to control the positive voltage limiter circuit 29 and the negative voltage limiter circuit 31 in such a manner that the program high voltage VPP and the erase high voltage −VPP are 9.75 V and −9.75 V, respectively, when the comparison result is $V_{cnt} \geq V_{ref1}$, and that the program high voltage VPP and the erase high voltage −VPP are 10.5 V and −10.5, respectively, when the comparison result is $V_{cnt} < V_{ref1}$.

Figure 8:
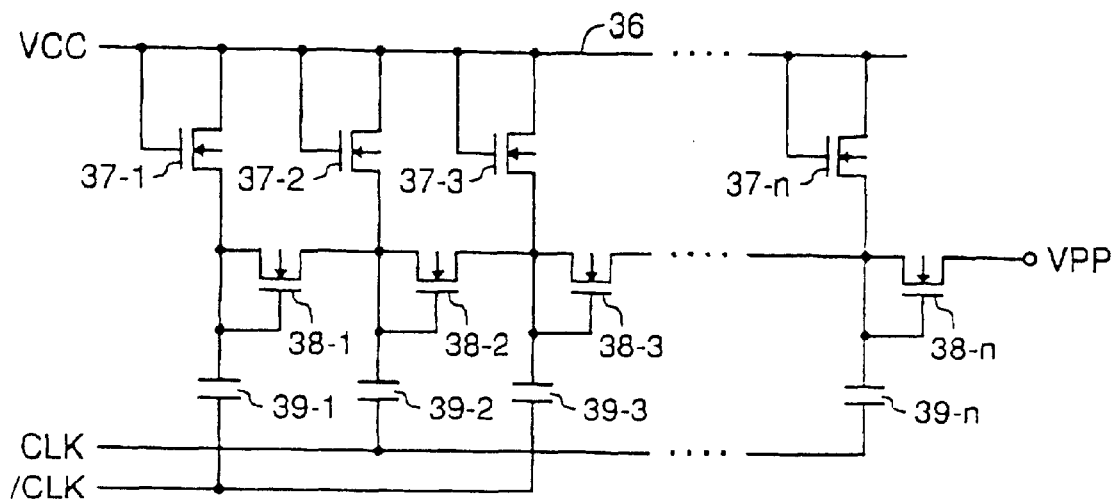
FIG. 8 is a circuit diagram showing the structure of a positive voltage booster circuit of the first embodiment of the non-volatile semiconductor memory device of the present invention.

FIG. 8 is a circuit diagram showing the structure of the positive voltage booster circuit 28. In this figure, reference numeral 36 indicates a power source line for supplying the power source voltage VCC. Reference numerals 37-1, 37-2, 37-3, 37-n, 38-1, 38-2, 38-3, and 38-n indicate n-channel MOS transistors, and 39-1, 39-2, 39-3, and 39-n indicate capacitors. CLK and /CLK indicate clock signals in a complementary relation. It should be understood that n-channel MOS transistors 37-4 to 37-(n−1) existing between the n-channel MOS transistors 37-3 and 37-n, n-channel MOS transistors 38-4 to 38-(n−1) existing between the n-channel MOS transistors 38-3 and 38-n, and capacitors 39-4 to 39-(n−1) existing between the capacitors 39-3 and 39-n are not shown in FIG. 8.

Figure 9:
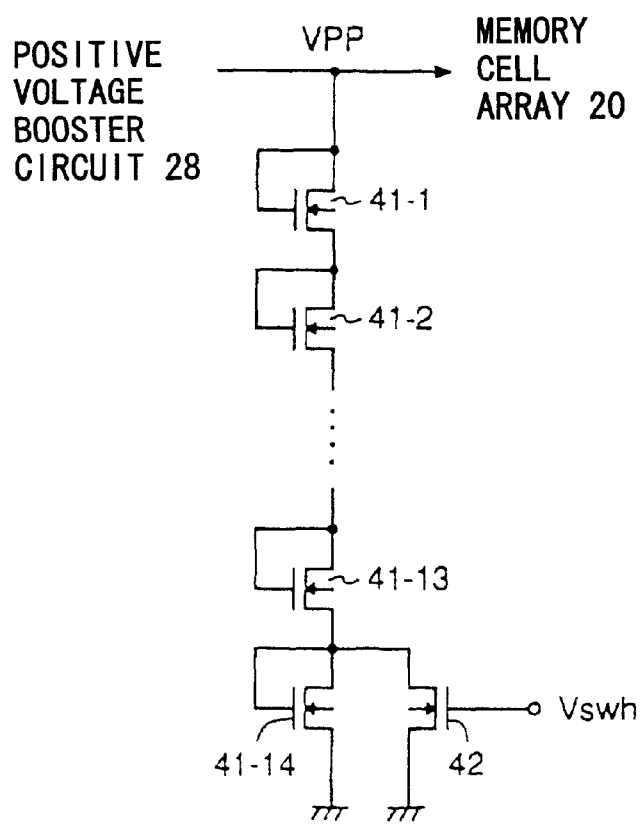
FIG. 9 is a circuit diagram showing the structure of a positive voltage limiter circuit of the first embodiment of the non-volatile semiconductor memory device of the present invention.

FIG. 9 is a circuit diagram showing the structure of the positive voltage limiter circuit 29. In this figure, reference numerals 41-1, 41-2, 41-13, and 41-14 indicate n-channel MOS transistors connected in series between the boosted voltage output terminal of the positive voltage booster circuit 28 and the ground in such a manner that the N-channel MOS transistors can function as diodes. Reference numeral 42 indicates an n-channel MOS transistor which is switched on and off in accordance with an output signal $V_{swh}$. The n-channel MOS transistors 41-3 to 41-12 existing between the n-channel MOS transistors 41-2 and 41-13 are not shown in this figure.

If the threshold voltage of the n-channel MOS transistors 41-1 to 41-14 is set at 0.75 V and the output signal $V_{swh}$ from the judgement circuit 34 is at a high level, the n-channel MOS transistor 42 is switched on, and the program high voltage VPP becomes 13×0.75=9.75 V. If the threshold voltage of the n-channel MOS transistors 41-1 to 41-14 is set at 0.75 V and the output signal $V_{swh}$ from the judgement circuit 34 is at a low level, the n-channel MOS transistor 42 is switched off, and the program high voltage VPP becomes 14×0.75=10.5 V.

Figure 10:
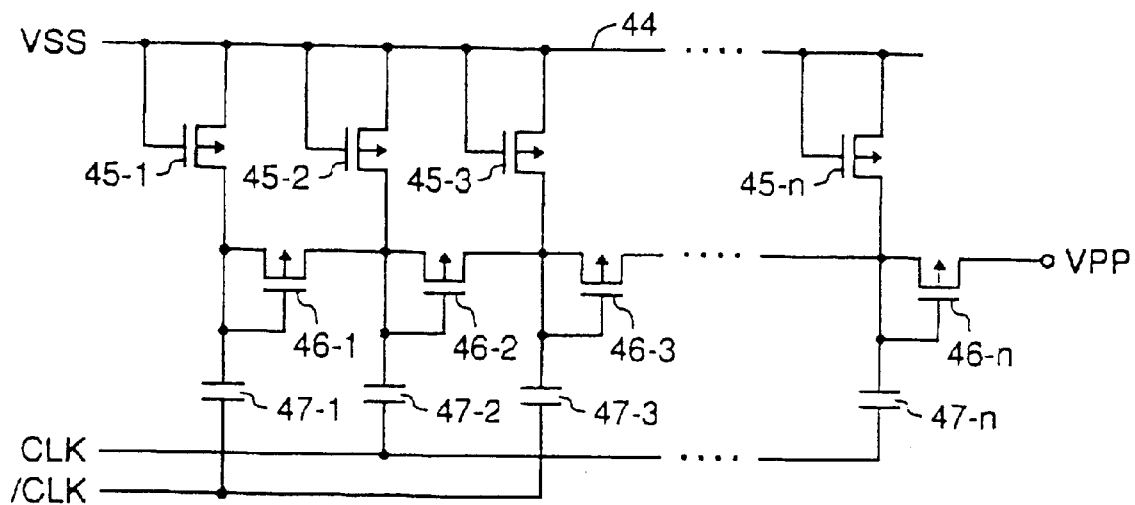
FIG. 10 is a circuit diagram showing the structure of a negative voltage booster circuit of the first embodiment of the non-volatile semiconductor memory device of the present invention.

FIG. 10 is a circuit diagram showing the structure of the negative voltage booster circuit 30. In this figure, reference numeral 44 indicates a ground conductor for supplying the ground voltage VSS. Reference numerals 45-1, 45-2, 45-3, 45-n, 46-1, 46-2, 46-3, and 46-n indicate p-channel MOS transistors. Reference numerals 47-1, 47-2, 47-3, and 47-n indicate capacitors. It should be understood that p-channel MOS transistors 45-4 to 45-(n−1) existing between the p-channel MOS transistors 45-3 and 45-n, p-channel MOS transistors 46-4 to 46-(n−1) existing between the p-channel MOS transistors 46-3 and 46-n, and capacitors 47-4 to 47-(n−1) existing between the capacitors 47-3 and 47-n are not shown in FIG. 10.

Figure 11:
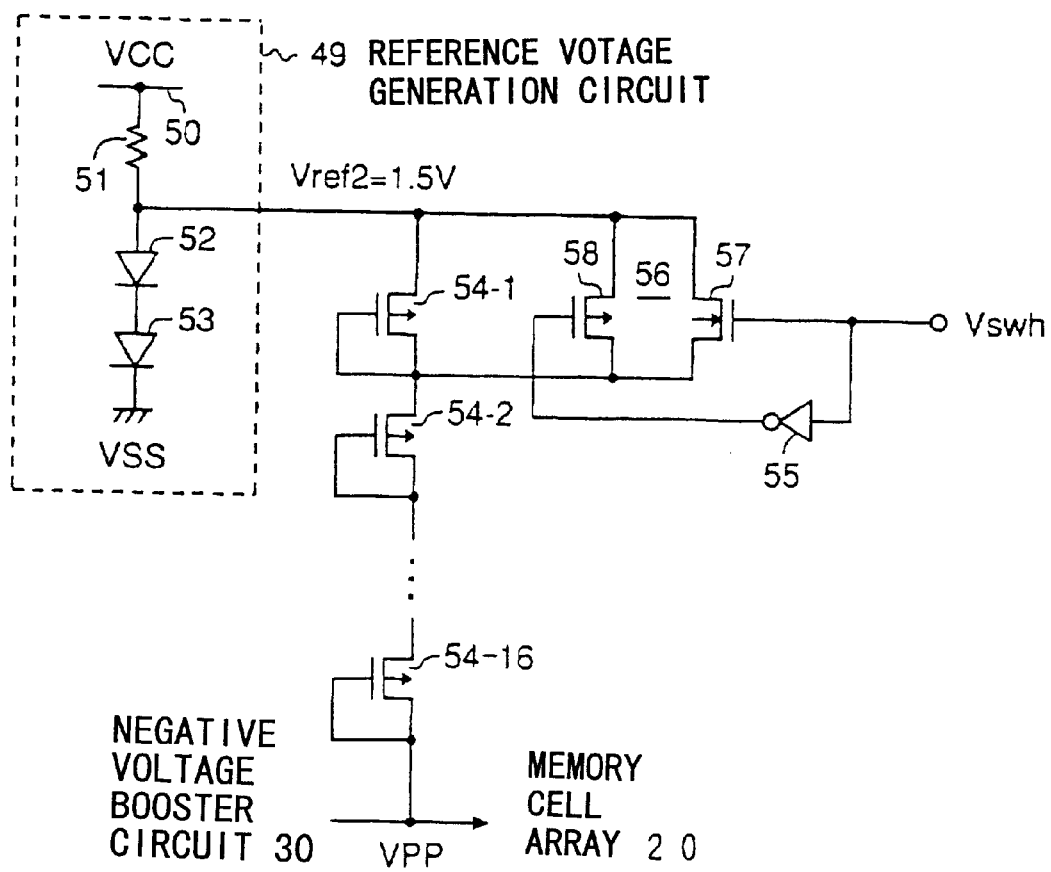
FIG. 11 is a circuit diagram showing the structure of a negative voltage limiter circuit of the first embodiment of the non-volatile semiconductor memory device of the present invention.

FIG. 11 is a circuit diagram showing the structure of the negative voltage limiter circuit 31. In this figure, reference numeral 49 indicates a reference voltage generation circuit which generates a voltage of 1.5 V as a reference voltage $V_{ref2}$. Reference numeral 50 indicates a power source line, reference numeral 51 indicates a resistance, and reference numerals 52 and 53 indicate diodes. Reference numerals 54-1, 54-2, and 54-16 indicate p-channel MOS transistors connected in series between the reference voltage output terminal of the reference voltage generation circuit 49 and the boosted voltage output terminal of the negative voltage booster circuit 30 in such a manner that the p-channel MOS transistors can function as diodes. P-channel MOS transistors 54-3 to 54-15 existing between the p-channel MOS transistors 54-2 and 54-16 are not shown in this figure. Also, reference numeral 55 indicates an inverter which inverts the output signal $V_{swh}$ from the judgement circuit 34, reference numeral 56 indicates a transmission switch circuit, reference numeral 57 indicates an n-channel MOS transistor which is switched on and off in accordance with the output signal $V_{swh}$ from the judgement circuit 34, and reference numeral 58 indicates a p-channel MOS transistor which is switched on and off in accordance with the output of the inverter 55.

If the threshold voltage of the p-channel MOS transistors 54-1 to 54-16 is set at 0.75 V and the output signal $V_{swh}$ from the judgement circuit 34 is at the high level, the transmission switch circuit 56 is switched on, and the erase high voltage −VPP becomes 1.5−15×0.75=−9.75 V. If the threshold voltage of the p-channel MOS transistors 54-1 to 54-16 is set at 0.75 V and the output signal $V_{swh}$ from the judgement circuit 34 is at the low level, the transmission switch circuit 56 is switched off, and the erase high voltage −VPP becomes 1.5−16×0.75=−10.5 V.

Figure 12:
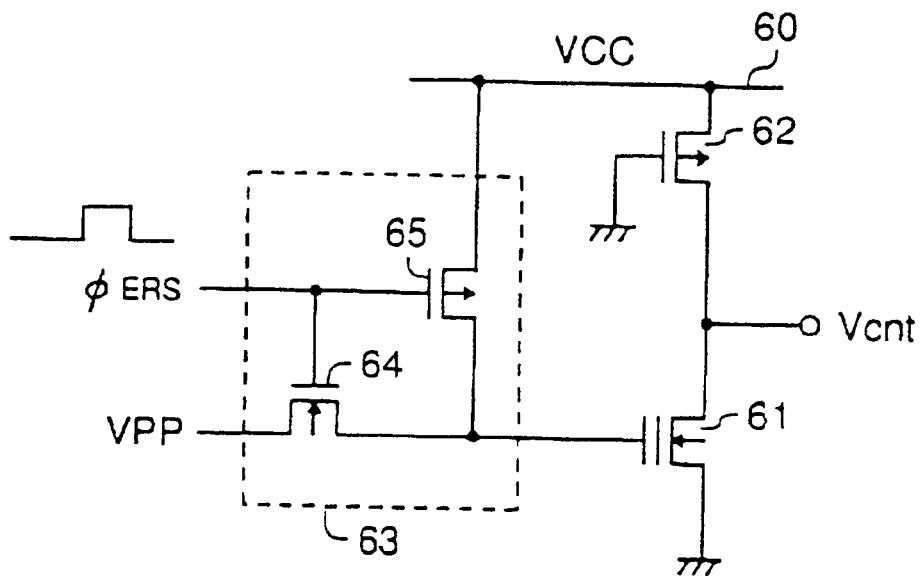
FIG. 12 is a circuit diagram showing the structure of a counter circuit of the first embodiment of the non-volatile semiconductor memory device of the present invention.

FIG. 12 is a circuit diagram showing the structure of the counter circuit 32. In this figure, reference numeral 60 indicates a power source line, reference numeral 61 indicates a stacked-gate-type n-channel MOS transistor which is electrically erasable and programmable for counting the times of rewrite of the non-volatile memory cells in the memory cell array 20, and reference numeral 62 indicates a p-channel MOS transistor which constitutes a load element. Reference numeral 63 indicates a control circuit which controls the stacked-gate-type n-channel MOS transistor 61, reference numeral 64 indicates an n-channel MOS transistor, and reference numeral 65 indicates a p-channel MOS transistor. $\phi_{ERS}$ indicates an erase control signal which is set at the high level in a pulse like manner every time erase is performed in the non-volatile memory cells in the memory cell array 20.

The n-channel MOS transistor 64 is switched on and off in accordance with the erase control signal $\phi_{ERS}$, with its source being connected to the gate of the stacked-gate-type n-channel MOS transistor 61 and its drain being connected to the output terminal of the positive voltage limiter circuit 29. The p-channel MOS transistor 65 is switched on and off in accordance with the erase control signals $\phi_{ERS}$, with its source being connected to the power source line 60 and its drain being connected to the stacked-gate-type n-channel MOS transistor 61.

If the erase control signal $\phi_{ERS}$ is set at the high level, the n-channel MOS transistor 64 is switched on, and the p-channel MOS transistor 65 is switched off. The program high voltage VPP is then supplied to gate of the stacked-gate-type n-channel MOS transistor 61, so that program is performed for the stacked-gate-type n-channel MOS transistor 61.

If the erase control signal $\phi_{ERS}$ is set at the low level, the n-channel MOS transistor 64 is switched off, and the p-channel MOS transistor 65 is switched on. The power source voltage VCC is then supplied to the gate of the stacked-gate-type n-channel MOS transistor 61, so that the stacked-gate-type n-channel MOS transistor 61 is put in a rear state. The train voltage of the stacked-gate-type n-channel MOS transistor 61 is outputted as a voltage $V_{cnt}$ indicating the time of rewrite in the non-volatile memory cells in the memory cell array 20.

Figure 13:
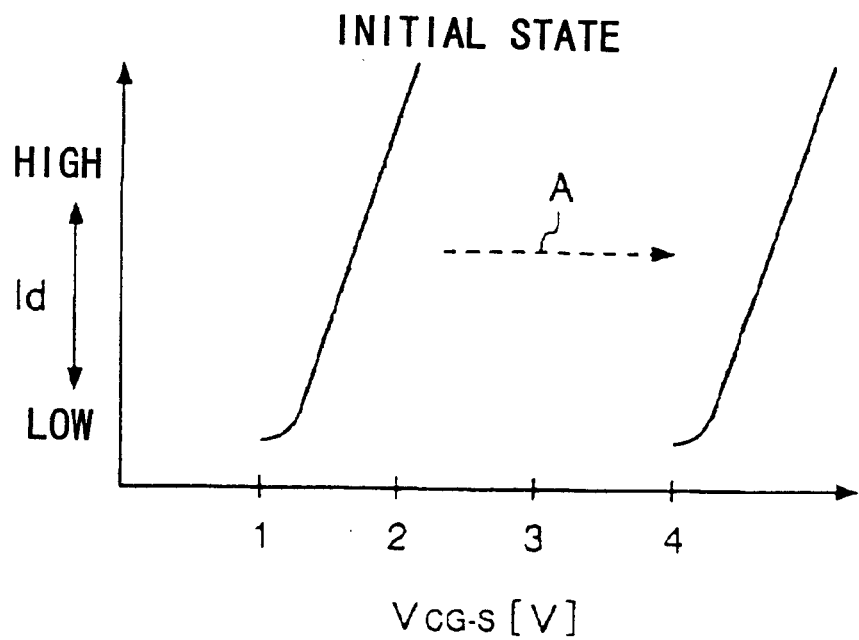
FIG. 13 illustrates an operation of the counter circuit of the first embodiment of the non-volatile semiconductor memory device of the present invention.

FIG. 13 illustrates an operation of the counter circuit 32, showing the relationship between the number of times of program in the stacked-gate-type n-channel MOS transistor 61 and the characteristics of the control gate source voltage ($V_{CG-S}$) to the drain current (Id) of the stacked-gate-type n-channel MOS transistor 61. In this figure, an arrow A shows that the characteristics the $V_{CG-S}$-Id characteristics of the stacked-gate-type n-channel MOS transistor 61 shifts to the right every time program is performed in the stacked-gate-type n-channel MOS transistor 61. Accordingly, the drain current Id becomes lower every time program is performed in the stacked-gate-type n-channel transistor 61. As a result, the output voltage $V_{cnt}$ of the counter circuit 32 becomes higher every time program/erase is performed in the memory cell array 20.

Figure 14:
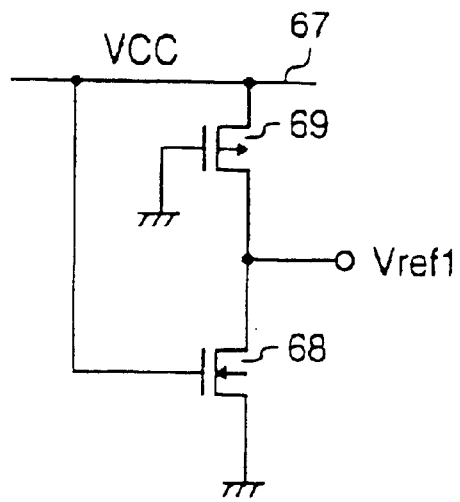
FIG. 14 is a circuit diagram showing the structure of a reference voltage generation circuit of the first embodiment of the non-volatile semiconductor memory device of the present invention.

FIG. 14 is a circuit diagram showing the structure of the reference voltage generation circuit 33. In this figure, reference numeral 67 indicates a power source line, reference numeral 68 indicates an n-channel MOS transistor, and reference numeral 69 indicates a p-channel MOS transistor which constitutes a load element. With this structure, the reference voltage generation circuit 33 has such a circuit constant that generates the reference voltage $V_{ref1}$ having the same voltage value as the output voltage $V_{cnt}$ of the counter circuit 32 when the number of times of program in the non-volatile memory cells in the memory cell array 20 reaches a predetermined value.

Figure 15:
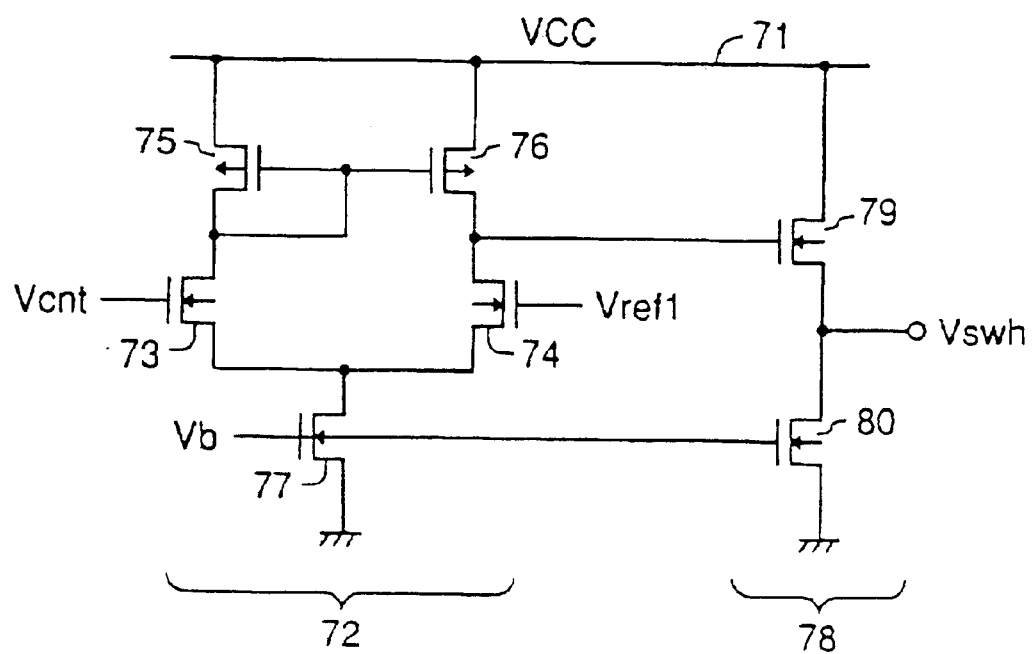
FIG. 15 is a circuit diagram showing the structure of a judgement circuit of the first embodiment of the non-volatile semiconductor memory device of the present invention.

FIG. 15 is a circuit diagram showing the structure of the judgement circuit 34. In this figure, reference numeral 71 indicates a power source line, and reference numeral 72 indicates a differential amplifier. Reference numeral 73 indicates an n-channel MOS transistor into which the output voltage $V_{cnt}$ of the counter circuit 32 is inputted, and reference numeral 74 indicates an n-channel MOS transistor into which the reference voltage $V_{ref1}$ is inputted. Reference numerals 75 and 76 indicate p-channel MOS transistors which constitute a current-mirror load circuit. Reference numeral 77 indicates a constant current source N-channel MOS transistor to which a bias voltage Vb is supplied. Reference numeral 78 indicates an output circuit, and reference numeral 79 indicates an n-channel MOS transistor which is switched on and off in accordance with the output of the differential amplifier 72. Reference numeral 80 indicates a constant current source n-channel MOS transistor to which the bias voltage Vb is supplied.

In the judgement circuit 34 having such a structure, the output signal $V_{swh}$ is maintained at the high level while the output voltage $V_{cnt}$ of the counter circuit 32 is equal to or smaller than the reference voltage Vref1. On the other hand, the output signal $V_{swh}$ is set at the low level when the output voltage $V_{cnt}$ of the counter circuit 32 becomes higher than the reference voltage $V_{ref1}$.

Figure 16:
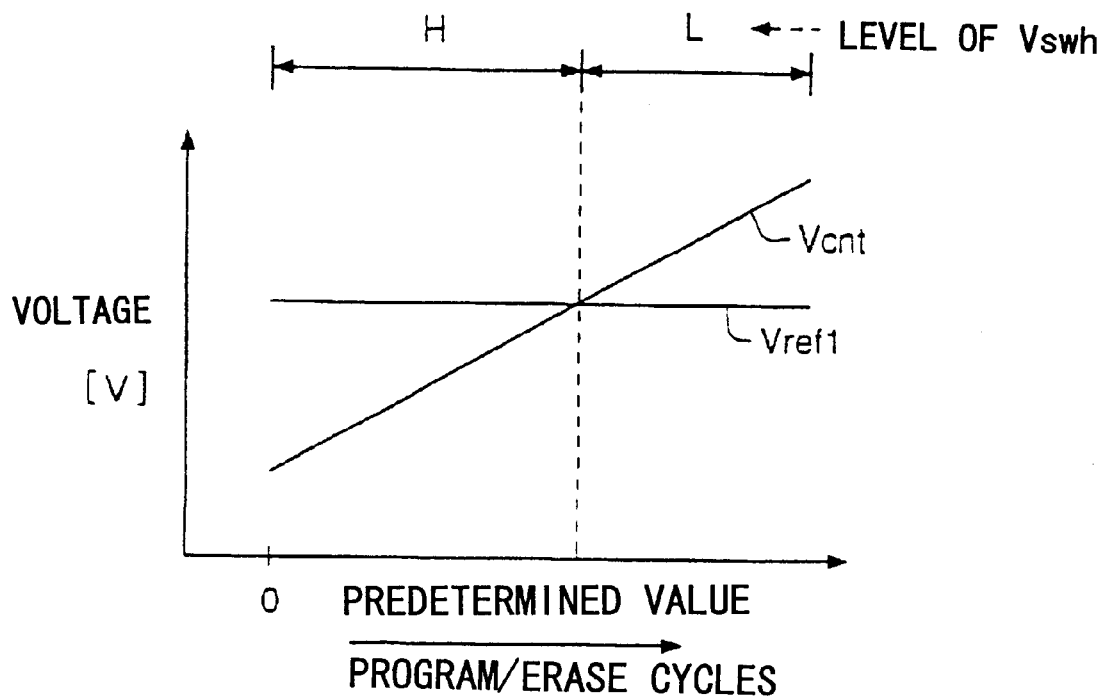
FIG. 16 illustrates an operation of the first embodiment of the non-volatile semiconductor memory device of the present invention.

FIG. 16 illustrates an operation of the first embodiment of the non-volatile semiconductor memory device of the present invention. This graph in FIG. 16 shows the relationship among the output voltage $V_{cnt}$ of the counter circuit 32, the reference voltage $V_{ref1}$, and the output signal $V_{swh}$ of the judgement circuit 34.

In the initial state, the output voltage $V_{cnt}$ of the counter circuit 32 is smaller than the reference voltage $V_{ref1}$. Thereafter, every time program/erase is performed in the non-volatile memory cells in the memory cell array 20, program is performed for the stacked-gate-type n-channel MOS transistor 61. Accordingly, every time program/erase is performed in the memory cell array 20, the output voltage $V_{cnt}$ of the counter circuit 32 becomes gradually higher. When the number of program/erase cycles in the memory cell array 20 reaches a predetermined value, the output voltage $V_{cnt}$ of the counter circuit 32 becomes equal to the reference voltage $V_{ref1}$. Thereafter, when the number of program/erase cycles in the memory cell array 20 exceeds the predetermined value, the output voltage $V_{cnt}$ of the counter circuit 32 becomes higher than the reference voltage $V_{ref1}$.

In the meantime, the output signal $V_{swh}$ of the judgement circuit 34 is maintained at the high level while the output voltage $V_{cnt}$ of the counter circuit 32 is equal to or smaller than the reference voltage $V_{ref1}$. The output signal $V_{swh}$ is set at the low level when the output voltage $V_{cnt}$ of the counter circuit 32 becomes higher than the reference voltage $V_{ref1}$. Here, while the output signal $V_{swh}$ of the judgement circuit 34 is maintained at the high level, the program high voltage VPP outputted from the positive voltage limiter circuit 29 is 9.75 V, and the erase high voltage −VPP outputted from the negative voltage limiter circuit 31 is −9.75 V. When the output signal $V_{swh}$ of the judgement circuit 34 switches to the low level, the program high voltage VPP outputted from the positive voltage limiter circuit 29 is 10.5 V, and the erase high voltage −VPP outputted from the negative voltage limiter 31 is −10.5 V.

Figure 17:
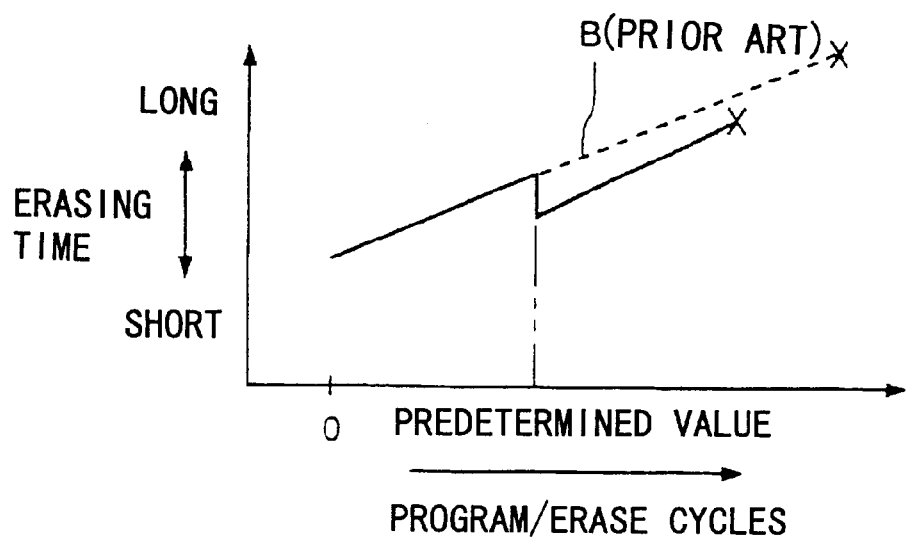
FIG. 17 illustrates effects of the first embodiment of the non-volatile semiconductor memory device of the present invention.

FIG. 17 is a graph illustrating the effects of the first embodiment of the non-volatile semiconductor memory device of the present invention. This graph shows the relationship between the number of program/erase cycles in the non-volatile memory cells and the erasing time. A broken line B in the graph indicates a case of the prior art.

As can be seen from the graph of FIG. 17, when the number of time of program/erase in the non-volatile memory cells in the memory cell array 20 exceeds the predetermined value, the program high voltage VPP and the erase high voltage −VPP each having a higher voltage value can be supplied to the non-volatile memory cells, thereby reducing the erasing time and speeding up the erasing operation. Thus, the high-speed performance can be maintained.

Also, in the first embodiment of the non-volatile semiconductor memory device of the present invention, the number of program/erase cycles in the non-volatile memory cells in the memory cell array 20 is added up by 1 every time program is performed in the stacked-gate-type n-channel MOS transistor 61 disposed in the counter circuit 32. Thus, the counter circuit 32 can be considerably smaller, compared with a counter circuit consisting of registers or the like.

Figure 18:
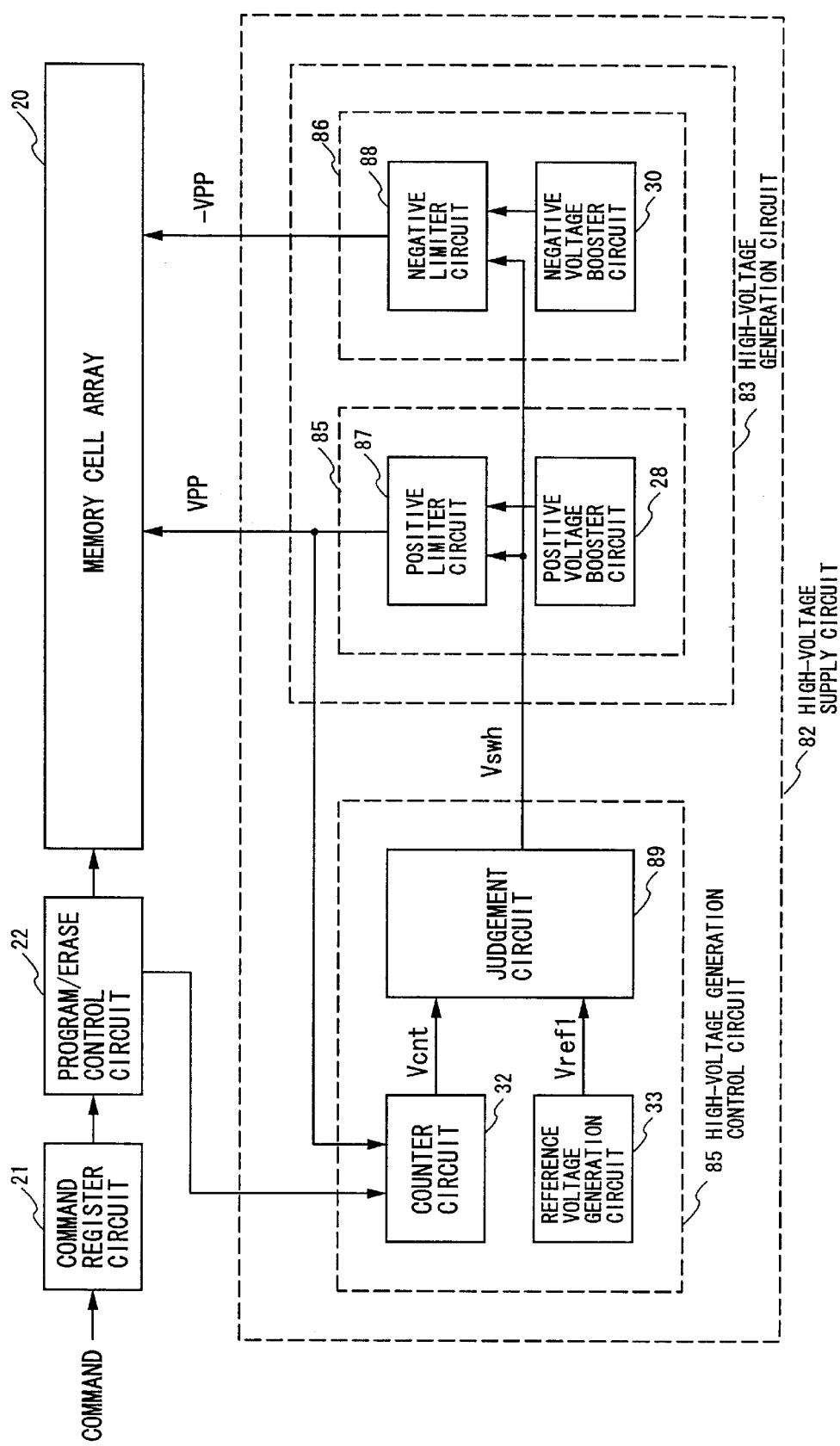
FIG. 18 is a circuit diagram showing a second embodiment of the non-volatile semiconductor memory device of the present invention.

FIG. 18 is a circuit diagram of a second embodiment of the non-volatile semiconductor device of the present invention. A high-voltage supply circuit 82 in this embodiment is different from the high-voltage supply circuit 23 in the first embodiment in the structure. The other components in the second embodiment are the same as in the first embodiment of the non-volatile semiconductor memory device of the present invention.

The high-voltage supply circuit 82 comprises a high-voltage generation circuit 83 and a high-voltage generation control circuit 84, both of which are different from the high-voltage generation circuit 24 and the high-voltage generation control circuit 25, respectively, of the high-voltage supply circuit 23 shown in FIG. 7.

The high-voltage generation circuit 83 comprises a program high-voltage generation circuit 85 and an erase high-voltage generation circuit 86, both of which are structurally different from the program high-voltage generation circuit 26 and the erase high-voltage generation circuit 27, respectively, contained in the high-voltage generation circuit 24 shown in FIG. 7.

The program high-voltage generation circuit 85 comprises a positive voltage limiter circuit 87 which is structurally different from the positive voltage limiter circuit 29 shown in FIG. 7. The other parts of the program high-voltage generation circuit 85 are the same as the program high-voltage generation circuit 26 shown in FIG. 7.

The erase high-voltage generation circuit 86 comprises a negative voltage limiter circuit 88 which is structurally different from the negative voltage limiter circuit 31 shown in FIG. 7. The other parts of the erase high-voltage generation circuit 86 are the same as the erase high-voltage generation circuit 27 shown in FIG. 7.

The high-voltage generation control circuit 84 comprises a judgement circuit 89 which is structurally different from the judgement circuit 34 contained in the high-voltage generation control circuit 25 shown in FIG. 7. The other parts of the high-voltage generation control circuit 84 are the same as the high-voltage generation control circuit 25 shown in FIG. 7.

Figure 19:
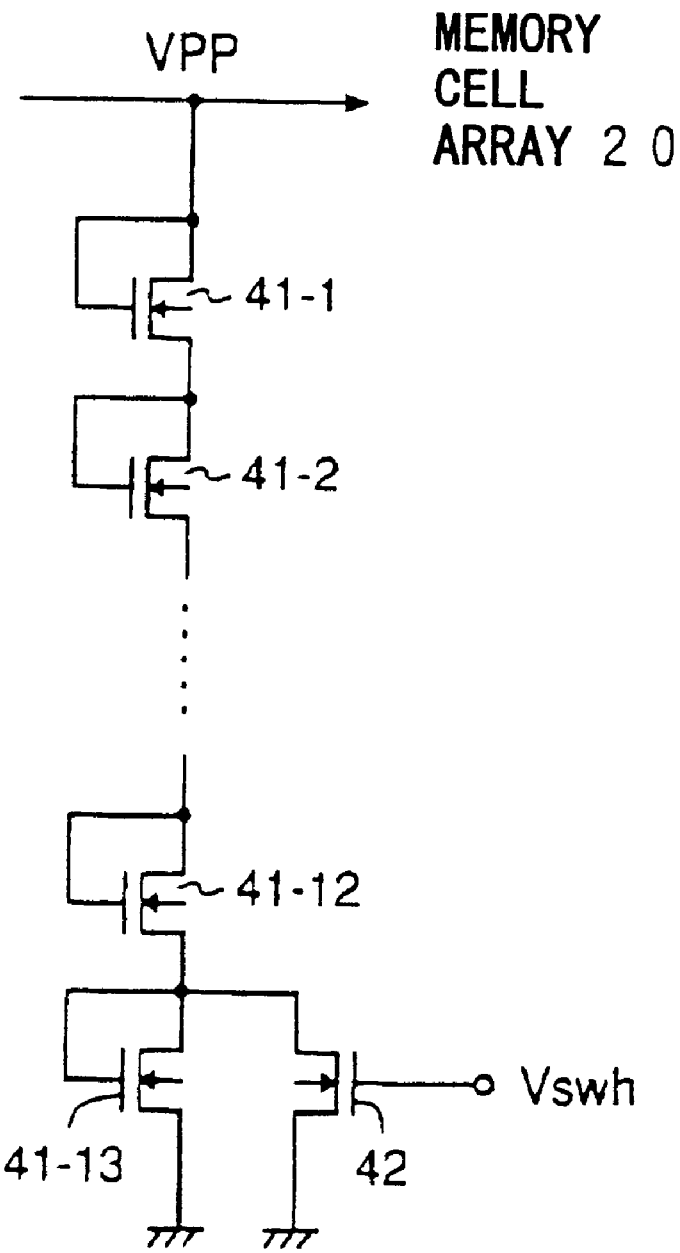
FIG. 19 is a circuit diagram showing the structure of a positive voltage limiter circuit of the second embodiment of the non-volatile semiconductor memory device of the present invention.

FIG. 19 is a circuit diagram showing the structure of the positive voltage limiter circuit 87. In this figure, reference numerals 41-1, 41-2, 41-12, and 41-13 indicate n-channel MOS transistors connected in series between the boosted voltage output terminal of the positive voltage booster circuit 28 and the ground in such a manner that the n-channel MOS transistors can function as diodes. As can be seen from FIG. 19, the number of n-channel MOS transistors in the positive voltage limiter circuit 87 is 1 less than in the positive voltage limiter circuit 29 shown in FIG. 9. The other parts of the positive voltage limiter circuit 87 are the same as the positive voltage limiter circuit 29 shown in FIG. 9.

If the threshold voltage of the n-channel MOS transistors 41-1 to 41-13 is set at 0.75 V and the output signal $V_{swh}$ of the judgement circuit 89 is at the high level, the n-channel MOS transistor 42 is switched on, and the program high voltage VPP is 12×0.75=9 V. If the threshold voltage of the n-channel MOS transistors 41-1 to 41-13 is set at 0.75 V and the output signal $V_{swh}$ of the judgement circuit 89 is at the low level, the n-channel MOS transistor 42 is switched off, and the program high voltage VPP is 13×0.75=9.75 V.

Figure 20:
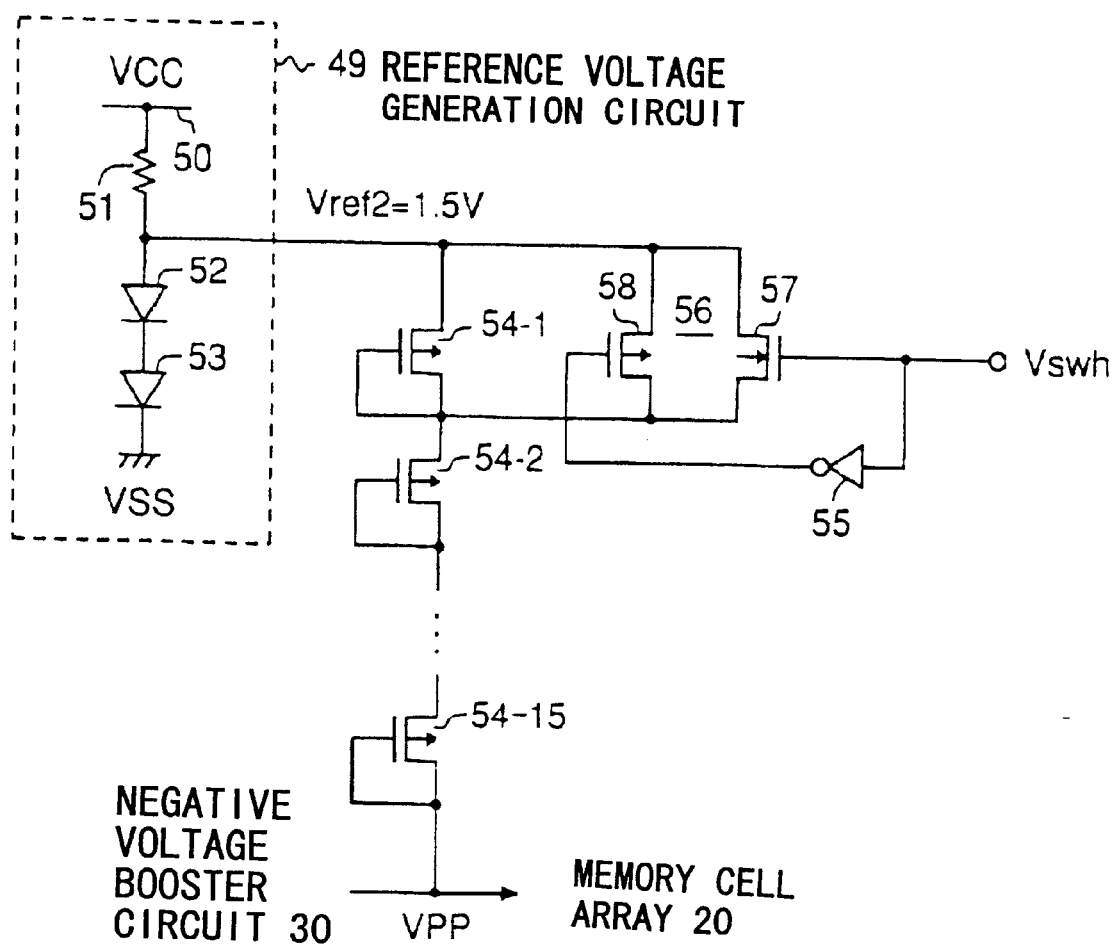
FIG. 20 is a circuit diagram showing the structure of a negative voltage limiter of the second embodiment of the non-volatile semiconductor memory device of the present invention.

FIG. 20 is a circuit diagram showing the structure of the negative voltage limiter circuit 88. In this figure, reference numerals 54-1, 54-2, and 54-15 indicate p-channel MOS transistors connected in series between the reference voltage output terminal of the reference voltage generation circuit 49 and the booted voltage output terminal of the negative voltage booster circuit 30 in such a manner that the p-channel MOS transistors can function as diodes. As can be seen from FIG. 20, the number of p-channel MOS transistors in the negative voltage limiter circuit 88 is 1 less than in the negative voltage limiter circuit 31 shown in FIG. 11. The other parts of the negative voltage limiter circuit 88 are the same as the negative voltage limiter circuit 31 shown in FIG. 11.

If the threshold voltage of the p-channel MOS transistors 54-1 to 54-15 is set at 0.75 V and the output signal $V_{swh}$ of the judgement circuit 89 is at the high level, the transmission switch circuit 56 is switched on, and the erase high voltage −VPP is (1.5−14)×0.75=−9 V. If the threshold voltage of the p-channel MOS transistors 54-1 to 54-15 is set at 0.75 V and the output signal $V_{swh}$ of the judgement circuit 89 is at the low level, the transmission switch circuit 56 is switched off, and the erase high voltage −VPP is (1.5−15)×0.75=−9.75 V.

Figure 21:
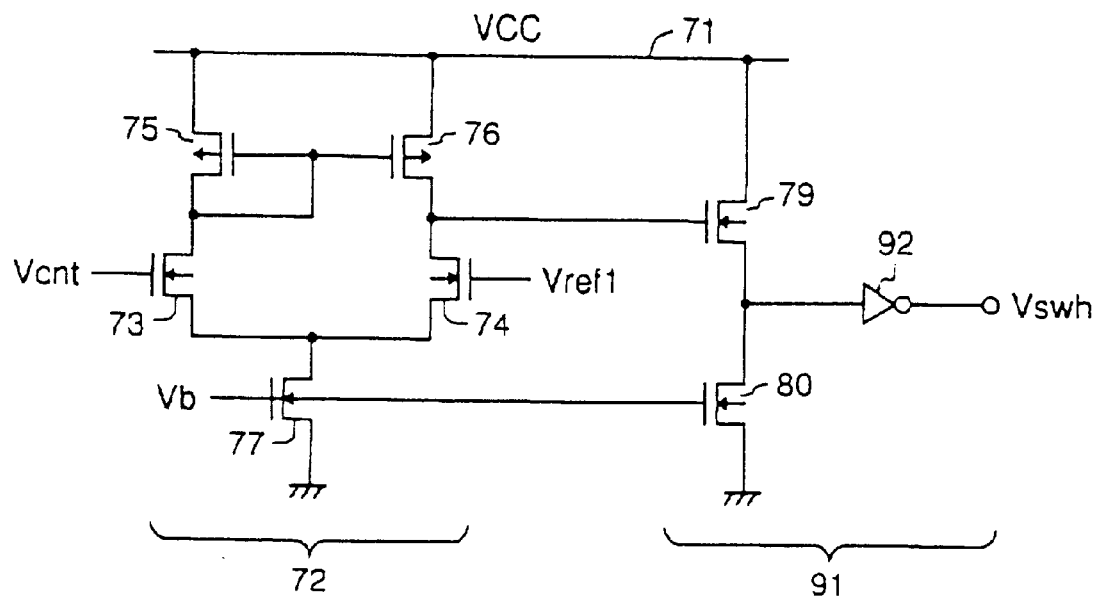
FIG. 21 is a circuit diagram showing the structure of a judgement circuit of the second embodiment of the non-volatile semiconductor memory device of the present invention.

FIG. 21 is a circuit diagram showing the structure of the judgement circuit 89. The judgement circuit 89 comprises an output circuit 91 which is structurally different from the output circuit 78 contained in the judgement circuit 34 shown in FIG. 15. The other parts of the judgement circuit 89 are the same as the judgement circuit 34.

The output circuit 91 comprises an inverter which inverts the source voltage of the n-channel MOS transistor 79, so that the output signal of the inverter 92 becomes the output signal $V_{swh}$ of the judgement circuit 89. The other aspects of the output circuit 91 are the same as the output circuit 78 shown in FIG. 15.

In the judgement circuit 89 having such a structure, the output signal $V_{swh}$ is maintained at the low level while the output voltage $V_{cnt}$ of the counter circuit 32 is equal to or smaller than the reference voltage $V_{ref1}$. The output signal $V_{swh}$ changes to the high level when the output voltage $V_{cnt}$ of the counter circuit 32 becomes higher than the reference voltage $V_{ref1}$.

Figure 22:
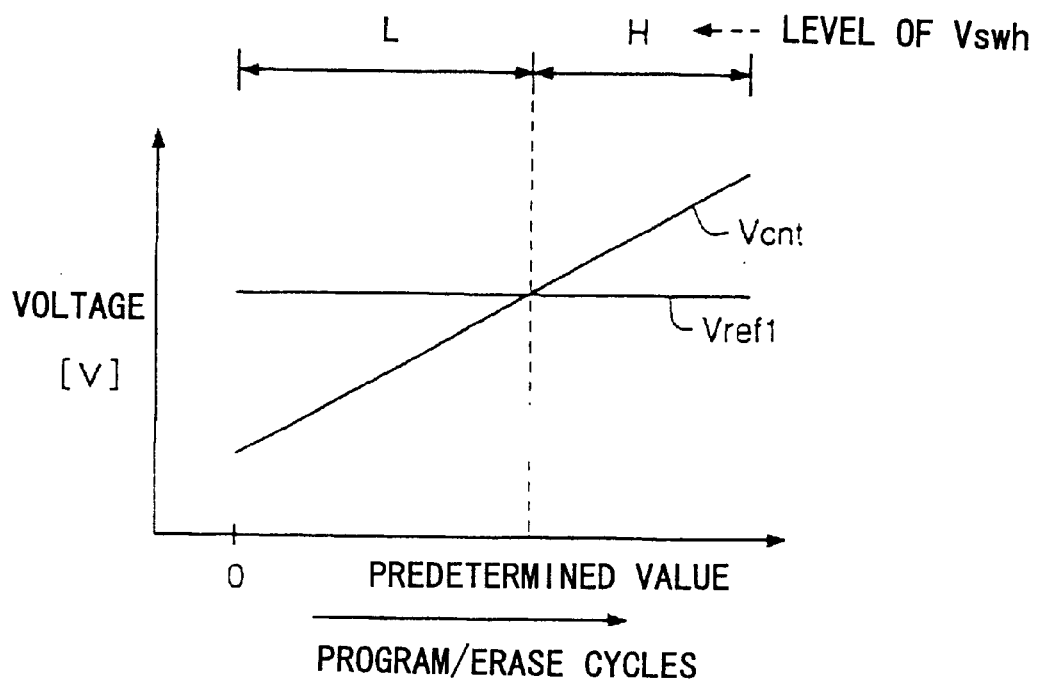
FIG. 22 illustrates an operation of the second embodiment of the non-volatile semiconductor memory device of the present invention.

FIG. 22 illustrates an operation of the second embodiment of the non-volatile semiconductor memory device of the present invention. The graph in FIG. 22 shows the relationship among the output voltage $V_{cnt}$ of the counter circuit 32, the reference voltage $V_{ref1}$, and the output signal $V_{swh}$ of the judgement circuit 89.

In the initial state, the output voltage $V_{cnt}$ of the counter circuit 32 is smaller than the reference voltage $V_{ref1}$. Thereafter, every time program/erase is performed in the non-voltage memory cells in the memory cell array 20, program is performed in the stacked-gate-type n-channel MOS transistor 61. Accordingly, every time program/erase is performed in the memory cell array 20, the output voltage $V_{cnt}$ of the counter circuit 32 becomes gradually higher. When the number of program/erase cycles in the memory cell array 20 reaches a predetermined value, the output voltage $V_{cnt}$ of the counter circuit 32 becomes equal to the reference voltage $V_{ref1}$. When the number of program/erase cycles in the memory cell array 20 exceeds the predetermined value, the output voltage $V_{cnt}$ of the counter circuit 32 becomes higher than the reference voltage $V_{ref1}$.

In the meantime, the output signal $V_{swh}$ of the judgement circuit 89 is maintained at the low level while the output voltage $V_{cnt}$ of the counter circuit 32 is equal to or smaller than the reference voltage $V_{ref1}$. The output signal $V_{swh}$ of the judgement circuit 89 changes to the high level when the output voltage $V_{cnt}$ of the counter circuit 32 becomes higher than the reference voltage $V_{ref1}$.

While the output signals $V_{swh}$ of the judgement circuit 89 is at the low level, the program high voltage VPP outputted from the positive voltage limiter circuit 87 is 9.75 V, and the erase high voltage −VPP outputted from the negative voltage limiter circuit 88 is −9.75 V. Thereafter, when the output signal $V_{swh}$ of the judgement circuit 89 changes to the high level, the program high voltage VPP outputted from the positive voltage limiter circuit 87 becomes 9 V, and the erase high voltage −VPP outputted from the negative voltage limiter circuit 88 becomes −9 V.

Figure 23:
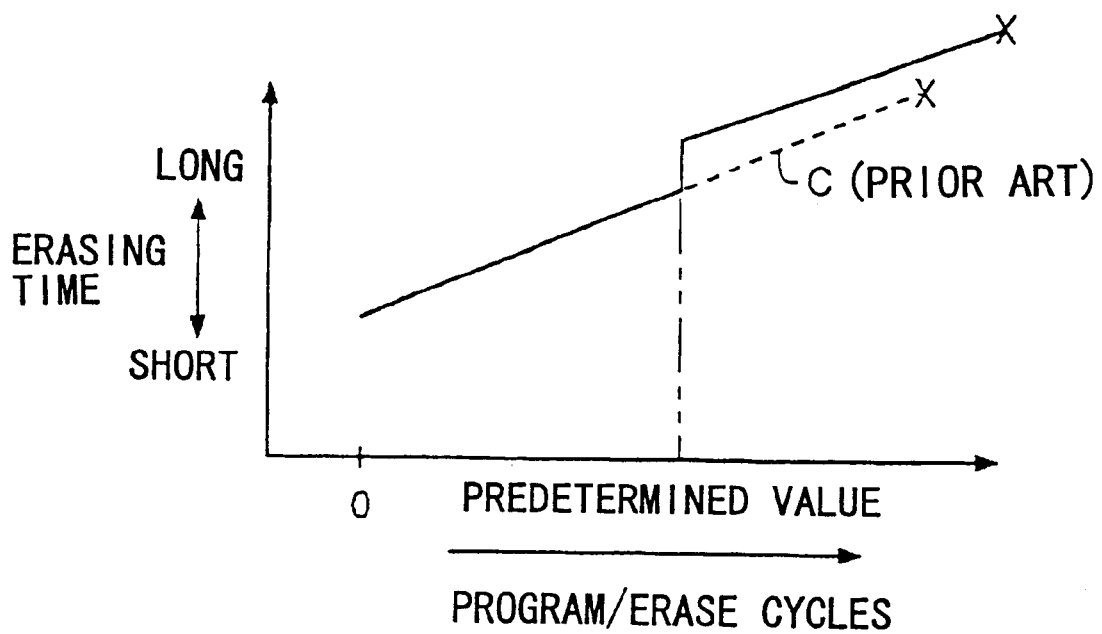
FIG. 23 illustrates effects of the second embodiment of the non-volatile semiconductor memory device of the present invention.

FIG. 23 illustrates the effects of the second embodiment of the non-volatile semiconductor memory device of the present invention. The graph in FIG. 23 shows the relationship between the number of program/erase cycles in the non-volatile memory cells and the erasing time. A broken line C in the graph shows a case of the prior art.

As can be seen from FIG. 23, when the number of program/erase cycles in the non-volatile memory cells in the memory cell array 20 exceeds the predetermined value, the program high voltage VPP and the erase high voltage −VPP both having a lower voltage value can be supplied to the non-volatile memory cell, thereby reducing the stress applied to the non-volatile memory cells. Thus, the lives of the non-volatile memory cells can be prolonged, and high reliability can be maintained.

Also, in the second embodiment of the non-volatile semiconductor memory device of the present invention, the number of program/erase cycles in the non-volatile memory cells in the memory cell array 20 is added up by 1 every time program is performed in the stacked-gate-type n-channel MOS transistor 61 disposed in the counter circuit 32. Thus, the counter circuit 32 can be considerably smaller than a counter circuit consisting of registers and the like.

The present invention is not limited to the specifically disclosed embodiments, but variations and modifications may be made without departing from the scope of the present invention.

The present application is based on Japanese priority application No. 10-358307, filed on Dec. 17, 1998, the entire contents of which are hereby incorporated for reference.

What is claimed is:

1. A non-volatile semiconductor memory device comprising:
   a memory cell array having arranged non-volatile memory cells which are electronically erasable and programmable; and
   a high-voltage supply circuit which supplies a first program voltage and a first erase voltage to the non-volatile memory cells in the memory cell array when a number of program/erase cycles in the non-volatile memory cells in the memory cell array is equal to or smaller than a predetermined value, and which supplies a second program voltage and a second erase voltage to the non-volatile memory cells in the memory cell array when the number of program/erase cycles in the non-volatile memory cells in the memory cell array is larger than the predetermined value,
   wherein the second program and erase voltages are higher than the first program and erase voltages, respectively.

2. The non-volatile semiconductor memory device as claimed in claim 1, wherein the high-voltage supply circuit comprises:
   a high-voltage generation circuit which selectively outputs the first program voltage and the first erase voltage, and the second program voltage and the second erase voltage; and
   a high-voltage generation control circuit which counts the number of program/erase cycles in the non-volatile memory cells in the memory cell array, and which controls the high-voltage generation circuit in such a manner that the high-voltage generation circuit outputs the first program voltage and the first erase voltage when a count value of program/erase in the non-volatile memory cells in the memory cell array is equal to or smaller than the predetermined value, and outputs the second program voltage and the second erase voltage when the count value of program/erase in the non-volatile memory cells in the memory cell array is larger than the predetermined value.

3. The non-volatile semiconductor memory device as claimed in claim 2, wherein:
   the high-voltage generation circuit comprises: a program high-voltage generation circuit which selectively outputs the first program voltage or the second program voltage; and an erase high-voltage generation circuit which selectively outputs the first erase voltage or the second erase voltage;
   the program high-voltage generation circuit comprises: a positive voltage booster circuit which generates a positive boosted voltage obtained by boosting a power source voltage; and a positive voltage limiter circuit which limits a voltage value of the positive booster voltage outputted from the positive voltage booster circuit under the control of the high-voltage generation control circuit, and which selectively outputs the first program voltage or the second program voltage; and
   the erase high-voltage generation circuit comprises: a negative voltage booster circuit which generates a negative boosted voltage obtained by boosting a ground voltage; and a negative voltage limiter circuit which limits a voltage value of the negative boosted voltage outputted from the negative voltage booster circuit under the control of the high-voltage generation control circuit, and which selectively outputs the first erase voltage or the second erase voltage.

4. The non-volatile semiconductor memory device as claimed in claim 2, wherein:
   the high-voltage generation control circuit comprises:
   a counter circuit which is provided with a program/erase-times counting stacked-gate-type MOS transistor in which program is performed every time program/erase is performed in the non-volatile memory cells in the memory cell array, and which outputs a drain voltage of the program/erase-times counting stacked-gate-type MOS transistor as the count value of program/erase in the non-volatile memory cells in the memory cell array;
   a reference voltage generation circuit which generates a reference voltage having the same voltage value as the output voltage of the counter circuit when the number of program/erase cycles in the non-volatile memory cells in the memory cell array becomes equal to the predetermined value; and
   a judgement circuit which compares the output voltage of the counter circuit with the reference voltage, and which controls the positive voltage limiter circuit and the negative voltage limiter circuit in such a manner that the first program voltage and the first erase voltage are outputted when the output voltage of the counter circuit is not higher than the reference voltage, and that the second program voltage and the second erase voltage are outputted when the output voltage of the counter circuit is higher than the reference voltage.

5. The non-volatile semiconductor memory device as claimed in claim 4, wherein:
   the counter circuit comprises a control circuit which controls the rewrite-times counting stacked-gate-type MOS transistor;
   the rewrite-times counting stacked-gate-type MOS transistor has a drain connected to the power source line via a load element, and a source grounded; and
   the control circuit supplies a program voltage to a gate of the rewrite-times counting stacked-gate-type MOS transistor every time program/erase is performed in the non-volatile memory cells in the memory cell array, and supplies a read voltage to the gate of the rewrite-times counting stacked-gate-type MOS transistor while no program voltage is supplied to the gate of the rewrite-times counting stacked-gate-type MOS transistor.

6. The non-volatile semiconductor memory device as claimed in claim 5, wherein the control circuit comprises:

a first switch unit which is connected between the gate of the rewrite-times counting stacked-gate-type MOS transistor and a program high-voltage output terminal of the program high-voltage generation circuit, the first switch unit being turned on every time program/erase is performed in the non-volatile memory cells in the memory cell array, and being off at other times; and a second switch unit which is connected between the gate of the rewrite-times counting stacked-gate-type MOS transistor and the power source line, the second switch unit being off while the first switch unit is on, and being on while the first switch unit is off.

7. The non-volatile semiconductor memory device as claimed in claim 6, wherein:

the first switch unit comprises an n-channel MOS transistor having a drain connected to the program high-voltage output terminal of the program high-voltage generation circuit, a source connected to the gate of the rewrite-times counting stacked-gate-type MOS transistor, and a gate to which an erase control signal for controlling an erase operation is applied; and the second switch unit comprises a p-channel MOS transistor having a source connected to the power source line, a drain connected to the gate of the rewrite-times counting stacked-gate-type MOS transistor, and a gate to which the erase control signal is applied.

8. A non-volatile semiconductor memory device comprising:

a memory cell array having arranged non-volatile memory cells which are electronically erasable and programmable; and a high-voltage supply circuit which supplies a first program voltage and a first erase voltage to the non-volatile memory cells in the memory cell array when a number of program/erase cycles in the non-volatile memory cells in the memory cell array is equal to or smaller than a predetermined value, and which supplies a second program voltage and a second erase voltage to the non-volatile memory cells in the memory cell array when the number of program/erase cycles in the non-volatile memory cells in the memory cell array is larger than the predetermined value, wherein the second program and erase voltages are higher than the first program and erase voltages, respectively.

9. The non-volatile semiconductor memory device as claimed in claim 8, wherein the high-voltage supply circuit comprises:

a high-voltage generation circuit which selectively outputs the first program voltage and the first erase voltage, and the second program voltage and the second erase voltage; and a high-voltage generation control circuit which counts the number of program/erase cycles in the non-volatile memory cells in the memory cell array, and which controls the high-voltage generation circuit in such a manner that the high-voltage generation circuit outputs the first program voltage and the first erase voltage when the count value of program/erase in the non-volatile memory cells in the memory cell array is equal to or smaller than the predetermined value, and outputs the second program voltage and the second erase voltage when the count value of program/erase in the non-volatile semiconductor memory cells in the memory cell array is larger than the predetermined value.

10. The non-volatile semiconductor memory device as claimed in claim 9, wherein:

the high-voltage generation circuit comprises: a program high-voltage generation circuit which selectively outputs the first program voltage or the second program voltage; and an erase high-voltage generation circuit which selectively outputs the first erase voltage or the second erase voltage;

the program high-voltage generation circuit comprises: a positive voltage booster circuit which generates a positive boosted voltage obtained by boosting a power source voltage; and a positive voltage limiter circuit which limits a voltage value of the positive boosted voltage outputted from the positive voltage booster circuit under the control of the high-voltage generation control circuit, and which selectively outputs the first program voltage or the second program voltage; and the erase high-voltage generation circuit comprises: a negative voltage booster circuit which generates a negative boosted voltage obtained by boosting a ground voltage; and a negative voltage limiter circuit which limits a voltage value of the negative boosted voltage outputted from the negative voltage booster circuit, and a negative voltage limiter circuit which selectively outputs the first erase voltage or the second erase voltage.

11. The non-volatile semiconductor memory device as claimed in claim 9, wherein the high-voltage generation control circuit comprises:

a counter circuit which is provided with a rewrite-times counting stacked-gate-type MOS transistor in which program is performed every time program/erase is performed in the non-volatile memory cells in the memory cell array, and which outputs a drain voltage of the rewrite-times counting stacked-gate-type MOS transistor as the count value of program/erase in the non-volatile memory cells in the memory cell array;

a reference voltage generation circuit which generates a reference voltage having the same voltage value as the output voltage of the counter circuit when the number of program/erase cycles in the non-volatile memory cells in the memory cell array becomes equal to the predetermined value; and a judgement circuit which compares the output voltage of the counter circuit with the reference voltage, and which controls the positive voltage limiter circuit and the negative voltage limiter circuit in such a manner that the first program voltage and the first erase voltage are outputted when the output voltage of the counter circuit is not higher than the reference voltage, and that the second program voltage and the second erase voltage are outputted when the output voltage of the counter circuit is higher than the reference voltage.

12. The non-volatile semiconductor memory device as claimed in claim 11, wherein:

the counter circuit comprises a control circuit which controls the rewrite-times counting stacked-gate-type MOS transistor;

the rewrite-times counting stacked-gate-type MOS transistor has a drain connected to the power source line via a load element, and a source grounded; and the control circuit supplies a program voltage to a gate of the rewrite-times counting stacked-gate-type MOS transistor every time program/erase is performed in the non-volatile memory cells in the memory cell array, and supplies a read voltage to the gate of the rewrite-times counting stacked-gate-type MOS transistor while no program voltage is supplied to the gate of the rewrite-times counting stacked-gate-type MOS transistor.

13. The non-volatile semiconductor memory device as claimed in claim 12, wherein the control circuit comprises:

a first switch unit which is connected between the gate of the rewrite-times counting stacked-gate-type MOS transistor and a program high-voltage output terminal of the program high-voltage generation circuit, the first switch unit being turned on every time program/erase is performed in the non-volatile memory cells in the memory cell array, and being off at other times; and a second switch unit which is connected between the gate of the rewrite-times counting stacked-gate-type MOS transistor and the power source line, the second switch unit being off while the first switch unit is on, and being on while the first switch unit is off.

14. The non-volatile semiconductor memory device as claimed in claim 13, wherein:

the first switch unit comprises an n-channel MOS transistor having a drain connected to the program high-voltage output terminal of the program high-voltage generation circuit, a source connected to the gate of the rewrite-times counting stacked-gate-type MOS transistor, and a gate to which an erase control signal for controlling an erase operation is applied; and the second switch unit comprises a p-channel MOS transistor having a source connected to the power source line, a drain connected to the gate of the rewrite-times counting stacked-gate-type MOS transistor, and a gate to which the erase control signal is applied.

15. An internal operation method for a non-volatile semiconductor memory device provided with a memory cell array having arranged non-volatile memory cells which are electronically erasable and programmable, said method comprising the steps of:

supplying a first program voltage and a first erase voltage to the non-volatile memory cells in the memory cell array when a number of program/erase cycles in the non-volatile memory cells in the memory cell array is equal to or smaller than a predetermined value; and supplying a second program voltage and a second erase voltage, each having an increased voltage value relative to the first program and erase voltages, to the non-volatile memory cells in the memory cell array when the number of program/erase cycles in the non-volatile memory cells in the memory cell array is larger than the predetermined value.

16. The method as claimed in claim 15, wherein:

whether the number of program/erase cycles in the non-volatile memory cells in the memory cell array is judged by performing program in a rewrite-times counting stacked-gate-type MOS transistor every time program/erase is performed in the non-volatile memory cells in the memory cell array and reading a drain current of the rewrite-times counting stacked-gate-type MOS transistor.

17. An internal operation method for a non-volatile semiconductor memory device provided with a memory cell array having arranged non-volatile memory cells which are electrically erasable and programmable, said method comprising the steps of:

supplying a first program voltage and a first erase voltage to the non-volatile memory cells in the memory cell array when the number of program/erase cycles in the non-volatile memory cells in the memory cell array is equal to or smaller than a predetermined value; and supplying a second program voltage and a second erase voltage each having a lowered voltage value to the non-volatile memory cells in the memory cell array when the number of program/erase cycles in the non-volatile memory cells in the memory cell array is larger than the predetermined value.

18. The method as claimed in claim 17, wherein:

whether the number of program/erase cycles in the non-volatile memory cells in the memory cell array is judged by performing program in a rewrite-times counting stacked-gate-type MOS transistor every time program/erase is performed in the non-volatile memory cells in the memory cell array and reading a drain current of the rewrite-times counting stacked-gate-type MOS transistor.

\* \* \* \* \*